(12) United States Patent
Wong et al.

(10) Patent No.: US 10,439,026 B2
(45) Date of Patent: Oct. 8, 2019

(54) FINS WITH SINGLE DIFFUSION BREAK FACET IMPROVEMENT USING EPITAXIAL INSULATOR

(71) Applicant: GLOBALFOUNDRIES INC., Grand Cayman (KY)

(72) Inventors: Chun Yu Wong, Ballston Lake, NY (US); Hui Zang, Guilderland, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/786,284

(22) Filed: Oct. 17, 2017

(65) Prior Publication Data

US 2019/0115426 A1   Apr. 18, 2019

(51) Int. Cl.
| | |
|---|---|
| *H01L 29/78* | (2006.01) |
| *H01L 29/06* | (2006.01) |
| *H01L 27/088* | (2006.01) |
| *H01L 21/8234* | (2006.01) |
| *H01L 29/66* | (2006.01) |
| *H01L 29/161* | (2006.01) |

(52) U.S. Cl.
CPC .. *H01L 29/0653* (2013.01); *H01L 21/823431* (2013.01); *H01L 21/823481* (2013.01); *H01L 27/0886* (2013.01); *H01L 29/161* (2013.01); *H01L 29/66545* (2013.01); *H01L 21/823418* (2013.01)

(58) Field of Classification Search
CPC ..... H01L 21/823431; H01L 21/823821; H01L 29/66795–66818; H01L 29/6681; H01L 29/785–7856; H01L 27/0886; H01L 2029/7857; H01L 2029/7858
See application file for complete search history.

(56) References Cited

U.S. PATENT DOCUMENTS

| | | |
|---|---|---|
| 7,351,993 B2 | 4/2008 | Atanackovic |
| 7,432,550 B2 | 10/2008 | Bojarczuk, Jr. et al. |
| 7,718,516 B2 | 5/2010 | Hao et al. |
| 8,361,879 B2 * | 1/2013 | Gutmann .......... H01L 21/76232 257/E21.549 |

(Continued)

OTHER PUBLICATIONS

J. P. Liu et al., "Epitaxial growth of Pr2O3 on Si(111) and the observation of a hexagonal to cubic phase transition during postgrowth N2 annealing", Appl. Phys. Lett., vol. 79, No. 5, Jul. 30, 2001, pp. 671-673.

(Continued)

*Primary Examiner* — Eric A. Ward
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to fin structures with single diffusion break facet improvement using an epitaxial insulator and methods of manufacture. The structure includes: a plurality of fin structures; an insulator material filling a cut between adjacent fin structures of the plurality of fin structures; a metal material (e.g., rare earth oxide or $SrTiO_3$) at least partially lining the cut; and an epitaxial source region or epitaxial drain region in at least one of the plurality of fin structures and adjacent to the metal material.

18 Claims, 4 Drawing Sheets

(56) References Cited

U.S. PATENT DOCUMENTS

| | | | |
|---|---|---|---|
| 8,790,991 B2* | 7/2014 | Cummings | H01L 21/76224 |
| | | | 257/506 |
| 8,846,491 B1 | 9/2014 | Pham et al. | |
| 8,916,460 B1* | 12/2014 | Kwon | H01L 21/845 |
| | | | 438/595 |
| 9,608,062 B1* | 3/2017 | Tseng | H01L 29/0653 |
| 2012/0112288 A1* | 5/2012 | Luo | H01L 21/76232 |
| | | | 257/368 |
| 2013/0069160 A1* | 3/2013 | Aquilino | H01L 21/76232 |
| | | | 257/368 |
| 2013/0119405 A1* | 5/2013 | Wu | H01L 29/66575 |
| | | | 257/77 |
| 2014/0374830 A1* | 12/2014 | Jeong | H01L 29/7855 |
| | | | 257/365 |
| 2015/0364361 A1* | 12/2015 | Cheng | H01L 21/76224 |
| | | | 257/506 |
| 2017/0025540 A1* | 1/2017 | Liou | H01L 29/7851 |
| 2018/0040694 A1* | 2/2018 | Tseng | H01L 21/76224 |
| 2018/0068998 A1* | 3/2018 | Wang | H01L 27/0207 |

OTHER PUBLICATIONS

H.J.Osten et al. "High-k dielectrics with Ultra-low leakage current based on praseodymium oxide". pp. 653-656, IEDM 2000.

* cited by examiner

FINS WITH SINGLE DIFFUSION BREAK FACET IMPROVEMENT USING EPITAXIAL INSULATOR

FIELD OF THE INVENTION

The present disclosure relates to semiconductor structures and, more particularly, to fin structures with single diffusion break facet improvement using an epitaxial insulator and methods of manufacture.

BACKGROUND

An integrated circuit (IC) chip includes a stack of several levels of sequentially formed layers to define devices (e.g., field effect transistors (FETs) and other active and passive components). In a typical complementary insulated gate FET process, layers are formed on a wafer to form the devices on a surface of the wafer. The surface may be a silicon layer on a silicon on insulator (SOI) wafer, as an example.

In finFET devices, for example, a dummy gate can cover an isolation trench between a pair of neighboring finFETs to enable a single diffusion break therein. The devices further comprise an epitaxial source region and drain region formed within the substrate, e.g., fin structures, with spacers formed along the finFETs and dummy gate. However, the patterning of the isolation trench to reach the required small critical dimensions (CD) is difficult with conventional lithography and etch techniques available. Furthermore, during formation of the circuits, the isolation trench can become larger than the dummy gate, and the epitaxy (epi) of the source region and drain region can grow non-ideally, which results in asymmetric growth resulting in facets. This is especially problematic when trying to land source and drain contacts on the epi of the source region and drain region. In this case, the contact area will not be positioned as desired, which may result in current crowding issues. This decreases yield, increases leakage and results in single diffusion break (SDB)/double diffusion break (DDB) device performance mismatch.

SUMMARY

In an aspect of the disclosure, a structure comprises: a plurality of fin structures; an insulator material filling a cut between adjacent fin structures of the plurality of fin structures; a metal material at least partially lining the cut; and an epitaxial source region or epitaxial drain region in at least one of the plurality of fin structures and adjacent to the rare earth material.

In an aspect of the disclosure, a structure comprises: an insulator material between adjacent fin structures of the plurality of fin structure; a metal material lining an upper portion of the insulator material; at least one of an epitaxial source material and epitaxial drain material; and a gate structure adjacent to the epitaxial source material and epitaxial drain material.

In an aspect of the disclosure, a method comprising: depositing insulator material between adjacent fin structures; recessing the insulator material and end portions of the adjacent fin structures; lining the recess of the insulator material between the adjacent fin structures with a metal material; filling in remaining portions of the recess with additional insulator material; and forming at least one of an epitaxial source material and epitaxial drain material in at least one of the adjacent fin structures, adjacent to a gate structure and in direct contact with the lining.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to fin structures with single diffusion break facet improvement using an epitaxial insulator and methods of manufacture. In more specific embodiments, the present disclosure provides a structure and fabrication processes which significantly improve fin eSiGe facet formation (e.g., reduces facet formation) by using a thin layer of epitaxial insulator growth at the single diffusion break (SDB) which, in conventional structures, would otherwise occur at an edge of a fin structure. Advantageously, by implementing the methods and structures described herein, improved yield with decreased leakage is achieved, with less SDB/DDB device performance mismatch.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii)

applying a patterned mask on top of the films by photolithographic imaging, and (iii) etching the films selectively to the mask.

Figure 1:
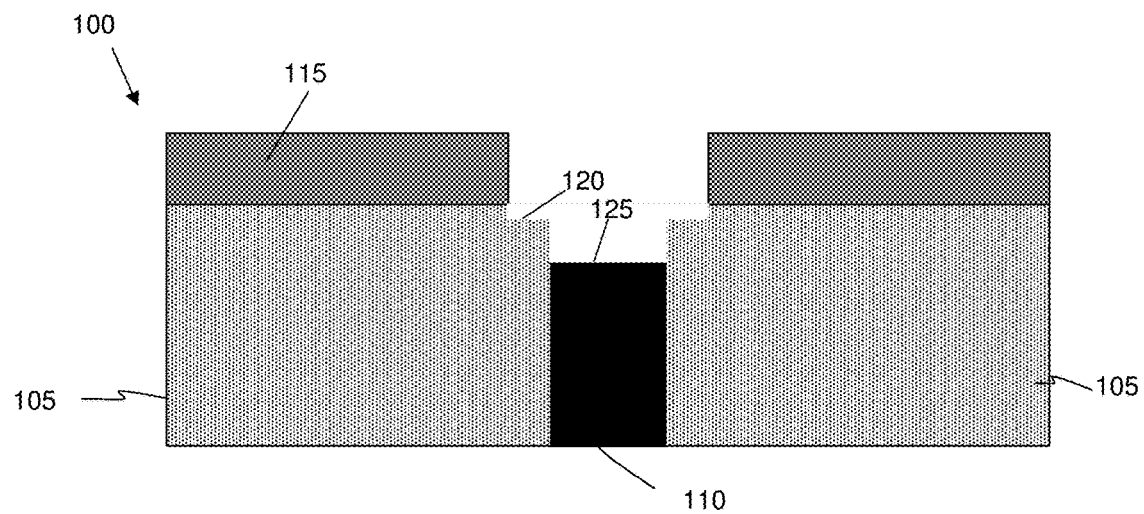
FIG. 1 shows a structure and respective fabrication processes in accordance with aspects of the present disclosure.

FIG. 1 shows a structure and respective fabrication processes in accordance with aspects of the present disclosure. In particular, the structure 100 includes fin structures 105, electrically isolated by insulator material, e.g., oxide, 110. For example, in embodiments, the insulator material 110 fills the cuts formed between adjacent fin structures to electrically isolate such adjacent fin structures 105. The insulator material 110 can be deposited using any conventional deposition method, e.g., chemical vapor deposition (CVD), etc., followed by a planarization process (e.g., chemical mechanical polishing (CMP)).

In embodiments, the fin structures 105 can be composed from any appropriate semiconductor material, e.g., including, but not limited to, Si, SiC, GaAs, InAs, InP, and other III/V or II/VI compound semiconductors, and a hardmask 115 is formed over the fin structures 105. The hardmask 115 can be, e.g., nitride (SiN) or other hardmask material.

The fin structures 105 can be fabricated using conventional sidewall image techniques (SIT). In an example of a SIT technique, a mandrel material, e.g., $SiO_2$ or other mandrel material, is deposited on the substrate using conventional CVD processes. A resist is formed on the mandrel material, and exposed to light to form a pattern (openings). A reactive ion etching is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

Still referring to FIG. 1, the hardmask 115 is formed over the fin structures 105 and insulator material 110. The hardmask 115 can be, e.g., nitride (SiN) or other hardmask material deposited on surfaces of the fin structures 105 and insulator material 110 using conventional CMOS processes, e.g., lithography, etching (RIE), deposition (CVD), and planarization (CMP). By implementing conventional CMOS processes, an opening is formed in the hardmask 115, which extends into a surface of adjacent fin structures 105 and the insulator material 110, forming a recessed area 120. Following the recess formation, a further etching process can be performed to remove oxide or other insulator material 110, forming a further recessed area 125 (of smaller cross sectional area than the recessed area 120). The recessed areas 120, 125 will expose the semiconductor material of the fin structures 105.

In more specific embodiments, the opening, recessed area 120 and recessed area 125 can be formed by conventional lithography and etching processes. For example, a resist or resist stack formed over the hardmask 115 is exposed to energy (light) to form a pattern (opening). An etching process with a selective chemistry, e.g., reactive ion etching (RIE), will be performed through the pattern to form the opening and recessed area 120. In embodiments, the etching process can be a timed etch process, as an example, to ensure proper recess depth in the adjacent fin structures 105 and insulator material 110.

An additional etching can be performed with a chemistry selective to the insulator material 110, prior or after removal of the resist, to form the recessed area 125. In embodiments, the recessed area 125 can be formed by an isotropic etching, with a chemistry selective to the oxide (or other insulator material). In this way, an additional mask is not required for this etching process. The resist can be removed by a conventional oxygen ashing process or other known stripants.

Figure 2:
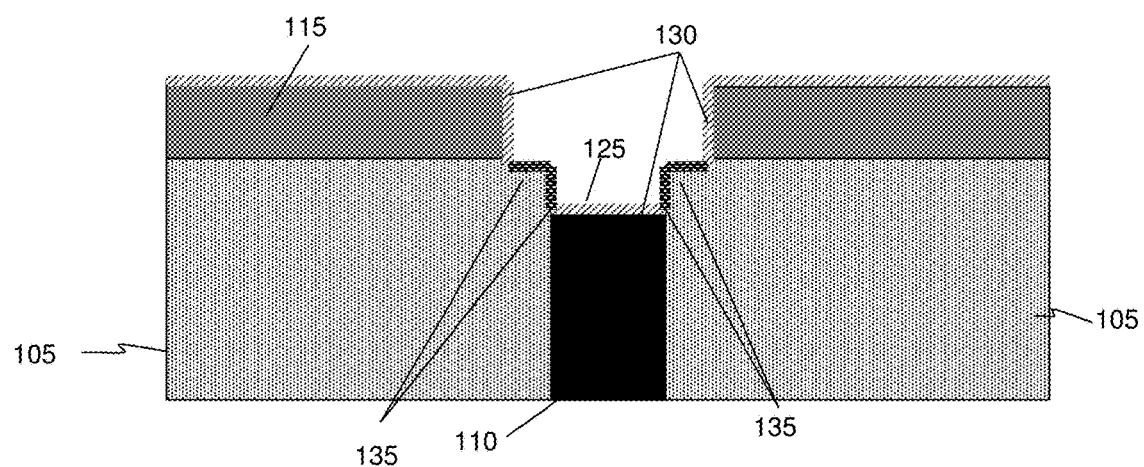
FIG. 2 shows a structure with recessed portions lined with amorphous and single crystalline epitaxial insulator material, amongst other features, and respective fabrication processes in accordance with additional aspects of the present disclosure.

In FIG. 2, a metal material 130, e.g., metal oxide material which may include, e.g., a rare earth oxide (REOx), e.g., $Pr_2O_3$, etc., SrTiO3 (STO), etc., is grown on exposed surfaces of the recessed areas 120, 125 and hardmask material 115 (including within the opening). In embodiments, the metal oxide 130 can be grown by known techniques including, e.g., atomic layer epitaxy (ALE), molecular-beam-epitaxy (MBE) or pulsed laser deposition techniques, to name a few. As should be understood by those of ordinary skill in the art, the growth of the metal material 130 on the exposed surfaces of the semiconductor material of the fin structures 105, e.g., in the recessed areas 120, 125, will form a single crystalline insulator film 135 on surfaces thereof. In this way, for example, $SrTiO_3$/Si interfaces will epitaxially crystallize without any amorphous oxide layer. In contrast, the growth of the metal oxide on the exposed surfaces of the hardmask 115 and the insulator material 110 will form an amorphous film 130, e.g., poly insulator material. In embodiments, the single crystalline insulator film 135 can be grown to a thickness of about 2 nm to about 3 nm; although other dimensions which do not completely fill the recesses are contemplated herein.

Figure 3:
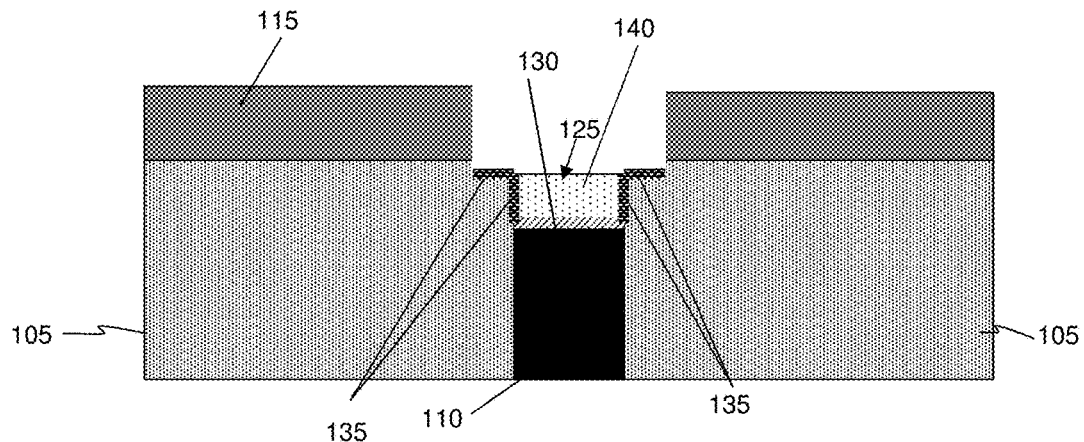
FIG. 3 shows a structure with the amorphous and single crystalline insulator material partially removed, amongst other features, and respective fabrication processes in accordance with additional aspects of the present disclosure.

As shown in FIG. 3, a material 140 is deposited in the recessed area 125 using conventional deposition methods, e.g., CVD, etc. The material 140 can be any appropriate hardmask material, e.g., SOH or other organic hardmask material, which will protect the crystalline insulator film 135 on the sidewalls of the recessed area 125 during a selective etching process of the amorphous film 130, e.g., any exposed poly insulator material on the hardmask 115. In embodiments, the amorphous film 130 can be removed by an isotropic etching process.

Figure 4:
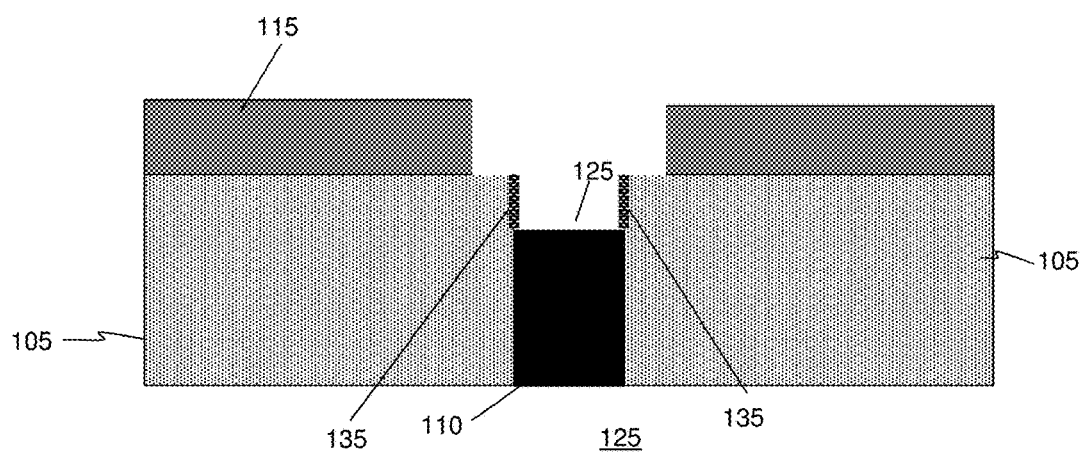
FIG. 4 shows a structure with single crystalline insulator material on sides of fin structures, amongst other features, and respective fabrication processes in accordance with additional aspects of the present disclosure.

As further shown in FIG. 4, the material 140 is removed from the recessed portion 125 to expose the underlying amorphous film 130 on the insulator material 110. The amorphous film 130 and any residual single crystalline insulator film 135 on the horizontal surfaces of the recessed area 125 can be removed by an anisotropic etching process. In this way, the single crystalline insulator film 135 will remain on the sidewalls of the recessed area 125, e.g., on vertical surfaces of the fin structures 105. In optional embodiments, it may be possible to perform a selective etching process which only removes the amorphous film 130.

Figure 5:
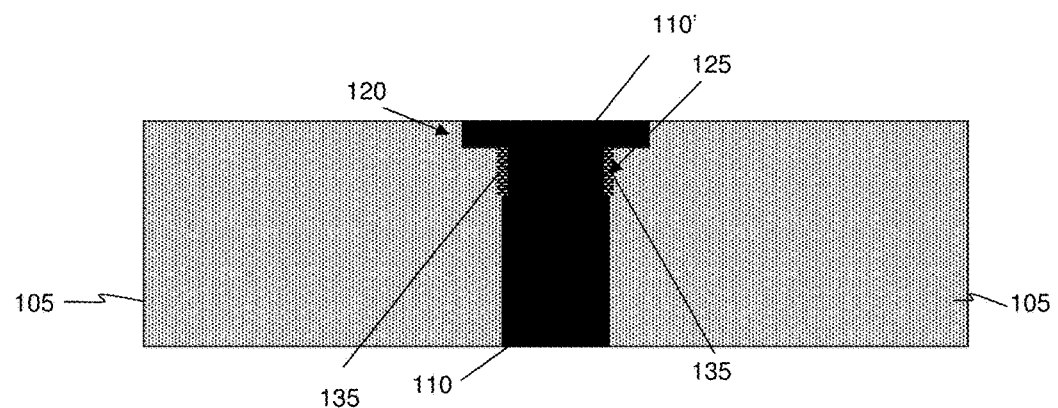
FIG. 5 shows a structure with insulator material on the single crystalline epitaxial insulator material on sides of fin structures, amongst other features, and respective fabrication processes in accordance with additional aspects of the present disclosure.

In FIG. 5, the recessed areas 120, 125 are filled with additional insulator material 110', e.g., oxide material, using conventional deposition processes (e.g., CVD). As shown in this representation, the single crystalline insulator film 135 will remain on the sidewalls of the recessed area 125 (and, in optional embodiments, on the sidewalls of the recessed areas 120) and, more specifically, embedded between the semiconductor material of the fin structure 105 (e.g., semiconductor material) and the insulator material 110'. The hardmask can be removed prior to or after filling of the recessed areas 120, 125, depending on the process of record. If the hardmask is removed prior to the filling process, any residual insulator material 110' on the surface of the fin structures 105 can be removed by a conventional CMP process, as is known by those of skill in the art.

Figure 6:
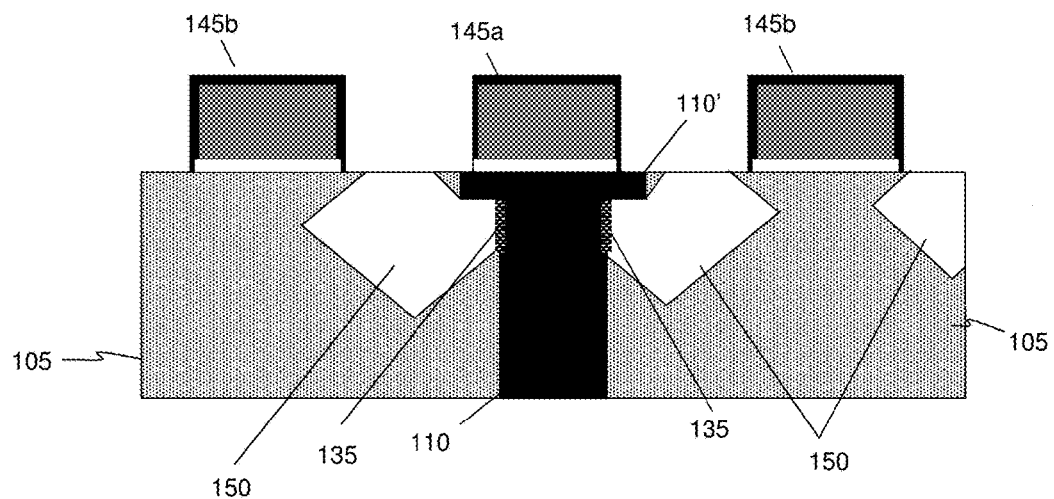
FIG. 6 shows a structure with gate structures and source/drain cavities, amongst other features, and respective fabrication processes in accordance with additional aspects of the present disclosure.

As shown in FIG. 6, for example, gate structures 145a and 145b can be fabricated using known materials, with known deposition and patterning processes. For example, the gate structures 145a, 145b can be formed using any conventional replacement gate process (or, for example, poly Si and SiO$_2$ for gate dielectric before replacement metal gate formation). In embodiments, the gate structure 145a is a dummy gate structure formed over the insulator material 110, 110', between adjacent fin structures 105. On the other hand, the gate structures 145b are formed on the fin structure 105, hence forming a finFET. In embodiments, the gate structures can comprise, for example, gate dielectric material, work-function metals and sidewall spacer/capping material, as is known in the art. For example, the gate dielectric material can be a high-k gate dielectric material, e.g., HfO$_2$ Al$_2$O$_3$, Ta$_2$O$_3$, TiO$_2$, La$_2$O$_3$, SrTiO$_3$, LaAlO$_3$, ZrO$_2$, Y$_2$O$_3$, Gd$_2$O$_3$, and combinations including multilayers thereof. The work-function metals can be any metals or metal alloys used in the fabrication of NFETs and/or PFETs, as is known to those of skill in the art. The sidewall spacer/capping material can be an oxide or nitride material.

As further representatively shown in FIG. 6, source and drain cavities 150 are formed in the fin structures 105, adjacent to the gate structure 145b. In embodiments, the cavities 150 can be diamond or round shaped and will extend to the insulator material 110, 110' exposing the crystalline insulator film 135. The cavities 150 can also extend under the overhang 110" of the insulator material that electrically isolates the adjacent fin structures 105.

Figure 7:
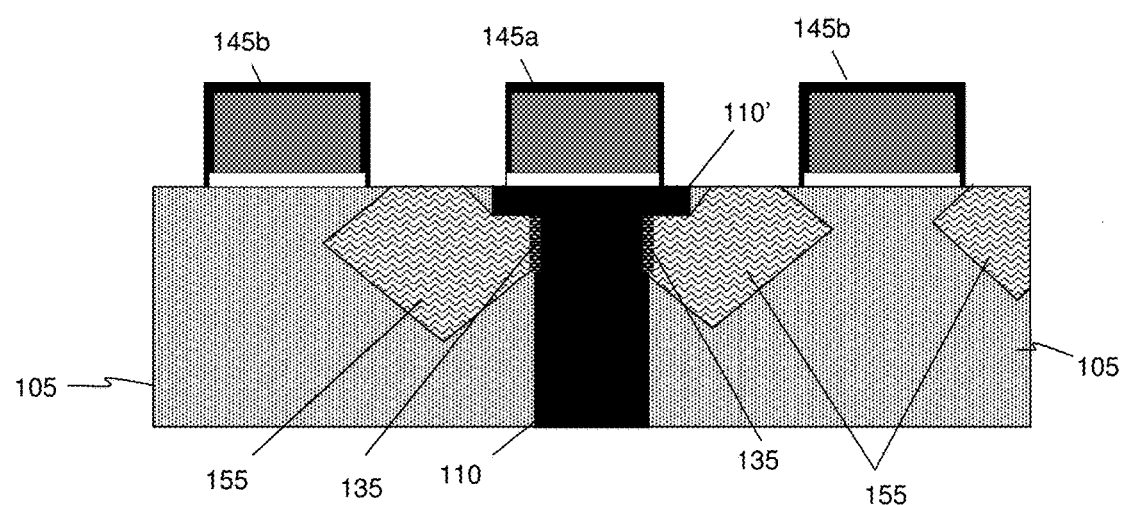
FIG. 7 shows a structure with gate structures with the source/drain cavities filled with epitaxial material, e.g., SiGe, with much reduced facet formation, amongst other features, and respective fabrication processes in accordance with additional aspects of the present disclosure.

FIG. 7 shows the source/drain cavities filled with epitaxial material with reduced facet formation, amongst other features. More specifically, as shown in FIG. 7, the cavities are filled with epitaxial material 155, e.g., SiGe material, that grows on exposed semiconductor material and the single crystalline material, e.g., single crystalline insulator film 135. Advantageously, by allowing the epitaxial material 155 to grow on the single crystalline insulator film 135, any facets over the source/drain eSiGe can be significantly reduced. That is, the single crystalline insulator film 135 will significantly reduce fin eSiGe facet formation at an edge of the fin structures, e.g., SDB FIN edge.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
    a plurality of fin structures;
    an insulator material filling a cut between adjacent fin structures of the plurality of fin structures, and filling a recess of the adjacent fin structures above the cut;
    a metal material at least partially lining vertical sidewalls of the cut below the recess, with the metal material embedded between the material of the adjacent fin structures and the insulator material within the cut and above the metal material within the recess; and
    an epitaxial source region or epitaxial drain region in at least one of the plurality of fin structures and adjacent to the metal material,
    wherein the metal material lining the sidewalls of the cut below the recess forms a single crystalline insulator film on the end portions of the adjacent fin structures.
2. The structure of claim 1, wherein the metal material is a rare earth oxide, embedded between material of the epitaxial source region or epitaxial drain region and the insulator material.
3. The structure of claim 2, wherein the insulator material is an oxide material and the material of the epitaxial source region or epitaxial drain region is semiconductor material that is grown in a cavity formed in the at least one of the plurality of fin structures.
4. The structure of claim 3, wherein the semiconductor material is SiGe, which grows on the rare earth material.
5. The structure of claim 1, wherein the metal material is a rare earth material or SrTiO$_3$.
6. The structure of claim 1, wherein the metal material lines an upper portion of the cut.
7. The structure of claim 1, wherein the metal material is directly contacting the epitaxial source region or epitaxial drain region.
8. A structure comprising:
    an insulator material between adjacent fin structures of a plurality of fin structures;
    a metal material lining sidewalls of recessed portion of an upper portion of the adjacent fin structures, the metal material being embedded between the insulator material and the sidewalls;
    at least one of an epitaxial source material and epitaxial drain material directly contacting the metal material lining the sidewalls; and
    a gate structure adjacent to the epitaxial source material and epitaxial drain material
    wherein the metal material lining sidewalls of the recessed portion of the upper portion of the adjacent fin structures forms a single crystalline insulator film on the end portions of the adjacent fin structures.
9. The structure of claim 8, wherein the metal material is an insulator material, directly contacting both the material of the at least one epitaxial source material and epitaxial drain material region and the insulator material.
10. The structure of claim 8, wherein the insulator material is an oxide material, the epitaxial source material is SiGe, the epitaxial drain material is SiGe and the metal material is a rare earth oxide or SrTiO$_3$.
11. The structure of claim 10, wherein the SiGe of the epitaxial source material and the epitaxial drain material are on opposing sides of the gate structure.

12. The structure of claim 10, wherein the SiGe of the epitaxial source material and the epitaxial drain material is grown in a cavity formed in the adjacent fin structures.

13. The structure of claim 10, wherein the SiGe grows on the metal material.

14. The structure of claim 10, wherein the insulator material is in a cut between the adjacent fin structures.

15. A method, comprising:
- depositing insulator material between adjacent fin structures;
- recessing the insulator material and end portions of the adjacent fin structures;
- lining the recess of the insulator material between the adjacent fin structures with a metal material;
- filling in remaining portions of the recess with additional insulator material; and
- forming at least one of an epitaxial source material and epitaxial drain material in at least one of the adjacent fin structures, adjacent to a gate structure and in direct contact with the lining,
- wherein the lining of the recess comprising growing the metal material on semiconductor material at the end portions of the adjacent fin structures, and
- wherein the metal material forms a single crystalline material on the end portions of the adjacent fin structures and amorphous material on the insulator material and hardmask material used to form the recess.

16. The method of claim 15, wherein the amorphous material is removed by etching processes.

17. The method of claim 15, wherein the epitaxial source material and epitaxial drain material are fabricated by forming a cavity in at least one of the adjacent fin structures, which exposes the metal material, and filling the cavity with semiconductor material.

18. The method of claim 17, wherein the filling of the cavity includes growing SiGe material on surfaces of the cavity including on the metal material.

* * * * *